United States Patent [19]
Kubota

[11] Patent Number: 5,644,527
[45] Date of Patent: Jul. 1, 1997

[54] SEMICONDUCTOR MEMORY DEVICE

[75] Inventor: Yasushi Kubota, Sakurai, Japan

[73] Assignee: Sharp Kabushiki Kaisha, Osaka, Japan

[21] Appl. No.: 448,756

[22] Filed: May 24, 1995

Related U.S. Application Data

[62] Division of Ser. No. 965,089, Oct. 22, 1992, abandoned.

[30] Foreign Application Priority Data

Oct. 22, 1991 [JP] Japan .................................. 3-274332
Feb. 3, 1992 [JP] Japan .................................. 4-017939

[51] Int. Cl.$^6$ .................................................. G11C 13/00
[52] U.S. Cl. ...................... 365/63; 365/51; 365/230.06
[58] Field of Search ........................ 365/51, 63, 72, 365/230.06

[56] References Cited

U.S. PATENT DOCUMENTS

| | | | |
|---|---|---|---|
| 5,058,058 | 10/1991 | Yasuda et al. | 365/63 X |
| 5,091,887 | 2/1992 | Asakura | 365/63 X |
| 5,134,588 | 7/1992 | Kubota et al. | 365/63 X |
| 5,214,600 | 5/1993 | Cho et al. | 365/51 |

FOREIGN PATENT DOCUMENTS

| | | |
|---|---|---|
| 60-167360 | 8/1985 | Japan . |
| 2-181964 | 7/1990 | Japan . |

OTHER PUBLICATIONS

Yamauchi et al., "A Circuit Design to Suppress Asymmetrical Characteristics in a 16–Mbit DRAM Sense Amplifier" *Symp. VLSI. Circuit Dig. Tech. Papers*, (1989) pp. 109–110.

Geppert et al., "Ion Microbeam Probing of Sense Amplifiers to Analyze Single Event Upsets in a CMOS DRAM" *IEEE Journal of Solid State Circuts*, (1991) 26(2):132–134.

*Primary Examiner*—Do Hyun Yoo
*Attorney, Agent, or Firm*—Morrison & Foerster

[57] ABSTRACT

A semiconductor memory device of the invention includes a plurality of word lines arranged along a first direction, a plurality of bit line pairs arranged along a second direction which crosses the first direction, a plurality of memory cells located at alternate crossings of the plurality of word lines and the plurality of bit line pairs, each of the plurality of memory cells being connected with one of the plurality of word lines and one bit line of one of the plurality of bit line pairs, and a plurality of sense amplifiers arranged along the first direction, each of the plurality of sense amplifiers being connected with one of the plurality of bit line pairs and amplifying a potential difference of the one bit line pair. In the semiconductor memory device, a region in which one of the sense amplifiers is formed has a larger width in the first direction than a width in the first direction of a region in which two columns of the memory cells connected to the one bit line pair connected to the sense amplifier.

2 Claims, 11 Drawing Sheets

SEMICONDUCTOR MEMORY DEVICE

This application is a division of application Ser. No. 07/965,089 filed Oct. 22, 1992, now abandoned.

BACKGROUND OF THE INVENTION

1. Field of the Invention:

The present invention relates to a semiconductor memory device, and more particularly, to a semiconductor device configuration in which memory cells are formed with high density.

2. Description of the Prior Art:

An exemplary arrangement of memory cells and sense amplifiers in a prior art dynamic random access memory (DRAM) is shown in FIG. 10. In this example, a DRAM of a folded bit line type is described. In a memory cell array 11, m word lines $W_j$ (j=0, 1, ..., m-1), and n bit line pairs $BL_i$, $\overline{BL}_i$ (i=0, 1, ..., n-1) which cross the word lines $W_j$ at right angles are formed. Memory cells 11a are formed at alternate crossings of the bit line pairs $BL_i$, $\overline{BL}_i$ and the word lines $W_j$.

At the side of the memory cell array 11, a sense amplifier array 12 is formed. In the sense amplifier array 12, a plurality of sense amplifiers 12a are formed. Each of the plurality of sense amplifiers 12a is connected to a bit line pair $BL_i$, $\overline{BL}_i$. The sense amplifier 12a is a circuit for differentially amplifying a small potential difference between a bit line $BL_i$ and a paired bit line $\overline{BL}_i$, so as to read out data stored in the memory cells 11a. Accordingly, it is necessary to provide the sense amplifier 12a for each bit line pair.

In FIG. 10, the reference label A indicates a region on the memory cell array 11 in which two columns of memory cells 11a to be connected to a common sense amplifier 12a are formed. Conventionally, the sense amplifier 12a is formed in a region having substantially the same width as that of the region A. The term "width" used herein means a length in a direction along the word lines $W_j$, unless the measuring direction is mentioned.

FIG. 11 schematically shows the arrangement of the above-mentioned memory cell array 11, and sense amplifier array 12. In FIG. 11, the reference label MA denotes a region in which the memory cell array 11 is formed, and SAA denotes a region in which the sense amplifier array 12 is formed. The reference label STN denotes a shunt region formed between the memory cell arrays 11. The shunt region is a region for shunting by forming a metal interconnection layer on the interconnection layer of the word lines $W_j$. The shunt region STN prevents a signal delay on the word lines $W_j$.

A technique for preventing a signal delay on the word lines $W_j$ by providing the shunt region STN between the memory cell array forming regions MA, a so-called Al shunt technique, will be briefly described. Usually, the word lines are formed from an interconnection of a polycrystalline silicon film (polysilicon gate) or an interconnection of a polycrystalline silicon film and a silicide film formed thereon (polycide gate). The reason why the above-mentioned films are used as a material of the word lines is that, since these films have a higher melting point than that of an aluminum (Al) film, these films are suitable for a self-align gate process. However, these films have a disadvantage in that they have a higher specific resistance than that of the Al film. For this reason, an Al interconnection is provided on a layer of these films in which the word lines are formed, and the Al interconnection and the word lines are connected at a plurality of points. As a result, wiring resistance as a whole are reduced.

The shunt region STN is provided between the memory cell array forming regions MA for the above-described reasons. However, as a result, a dummy pattern of a memory cell or a pattern for reducing a difference in level between the shunt region STN and the memory cell array forming regions MA is required. Especially when a stacked memory cell is used, a wide pattern for reducing a difference in level is required. The reason is as follows. In the stacked memory cell, a capacitor is formed on a MOS transistor, so that the difference in level between the memory cell array forming region MA and the shunt region STN is large. As a result, it has been found that the shunt region STN occupies a relatively large area on a chip. Conventionally, a region at the side of the shunt region STN is not utilized.

As the DRAM is made to have a larger capacity in a given area, it is required to form memory cells 11a with higher density. This leads to the width of the region A on the memory cell array 11 needing to be made smaller. However, there is a limit to how much smaller the width of the sense amplifier 12a can be made. The reason is as follows. Since a transistor in the sense amplifier 12a is desired to be capable of detecting a very small potential difference, it is necessary to make the channel length and the width of source/drain regions larger than those of a usual transistor. If the channel of the transistor is short, there exists a possibility that the threshold voltage of the transistor will vary. If the source/drain regions are narrow, the imbalance of capacitance on the input terminal side of the sense amplifier 12a increases. Thus, in the DRAM having a larger capacity, there exists a problem in that it is difficult to maintain the sensitivity of the sense amplifier 12a.

As a countermeasure against the above problem, an arrangement has been proposed as is shown in FIG. 12 in which sense amplifier arrays 12 and 13 are located at both sides of the memory cell array 11. For example, see Japanese Laid-Open Patent Publication No. 2-181964. With this arrangement, bit line pairs are alternately connected to sense amplifiers 12a on the sense amplifier array 12 at one side and to sense amplifiers 13a on the sense amplifier array 13 at the other side. As a result, the width of each of the regions which are necessary for forming the sense amplifiers 12a and 13a can be made to be twice as large as that of the region A which is necessary for forming two columns of memory cells 11a.

However, when the sense amplifier arrays 12 and 13 are located at both the sides of the memory cell array 11, the area occupied by the sense amplifier arrays 12 and 13 is increased. This causes a problem in that the area of a chip becomes large.

Furthermore, when the capacity of the DRAM exceeds 64 megabits according to this arrangement, the width of the region A on the memory cell array 11 still must be made smaller. This causes a problem in that it is difficult to maintain the sensitivity of the sense amplifiers 12a and 13a for the same reasons mentioned above.

FIG. 13 schematically shows an arrangement of memory cell arrays 11 and column decoders 14. In FIG. 13, the reference label M indicates a region in which a memory cell column consisting, for example, of eight columns of memory cells corresponding to one column decoder 14 is formed. The column decoders 14 are located at the same intervals as those of the memory cell columns in the direction along the word lines. Accordingly, the width of the column decoder 14 is limited by the width of the memory cell forming region M. Therefore, in order to ensure the area of the column decoder 14, it is necessary to ensure the length of the column decoder 14 in a direction along the bit lines.

SUMMARY OF THE INVENTION

The semiconductor memory device of this invention, includes: a plurality of word lines arranged along a first direction; a plurality of bit line pairs arranged along a second direction which crosses the first direction; a plurality of memory cells located at alternate crossings of the plurality of word lines and the plurality of bit line pairs, each of the plurality of memory cells being connected with one of the plurality of word lines and one bit line of one of the plurality of bit line pairs; a plurality of sense amplifiers arranged along the first direction, each of the plurality of sense amplifiers being connected with one of the plurality of bit line pairs and amplifying a potential difference of the one bit line pair; and wherein a region in which one of the sense amplifiers is formed has a larger width in the first direction than a width in the first direction of a region in which two columns of the memory cells connected to the one bit line pair connected to the sense amplifier.

Alternatively, the semiconductor memory device of the invention includes: a plurality of word lines arranged along a first direction; a plurality of bit lines arranged along a second direction which crosses the first direction, the plurality of bit lines being divided into a plurality of bit line groups, each of the bit line groups including at least one of the bit lines; a plurality of memory cells arranged at alternate crossings of the plurality of word lines and the plurality of bit lines, each of the memory cells being connected to one of the plurality of word lines and one of the plurality of bit lines; a plurality of column decoders arranged along the first direction, each of the plurality of column decoders for selecting one of the plurality of bit line groups in accordance with an address signal; and wherein a region in which one of the column decoders is formed has a larger width in the first direction than a width in the first direction of a region in which the bit line group selected by the column decoder is formed.

Alternatively, the semiconductor memory device of the invention includes: a plurality of word lines; a plurality of bit lines; a plurality of first regions in which respective memory cell arrays including a plurality of memory cells are formed; at least one second region provided between the first regions for reducing the resistance of the plurality of word lines, the first regions and second region being arranged along a first direction; and wherein, at the side of the second region, a region is located in which a circuit is formed for selecting at least one of the plurality of bit lines.

Alternatively, the semiconductor memory device of the invention includes: a plurality of memory arrays arranged with a shunt region separating at least two of the memory arrays; and sense amplifier means for accessing individual memory cells in at least one of the memory arrays, at least a portion of the sense amplifier means being positioned at a side of the shunt region.

Alternatively, the semiconductor memory device of the invention includes: a plurality of memory arrays arranged with a shunt region separating at least two of the memory arrays; and column decoder means for accessing individual memory cells in at least one of the memory arrays, at least a portion of the column decoder means being positioned at a side of the shunt region.

Thus, the invention described herein makes possible the advantages of (1) providing a semiconductor memory device in which, even when the memory cells are formed with high density, it is possible to maintain the sensitivity of a sense amplifier, and (2) providing a semiconductor memory device in which the chip area can be made smaller by improving the space efficiency of the whole chip.

These and other advantages of the present invention will become apparent to those skilled in the art upon reading and understanding the following detailed description with reference to the accompanying figures.

DESCRIPTION OF THE PREFERRED EMBODIMENTS

The present invention will be described by way of examples and with reference to the drawings, wherein like reference labels are used to refer to like elements.

EXAMPLE 1

Figure 1:
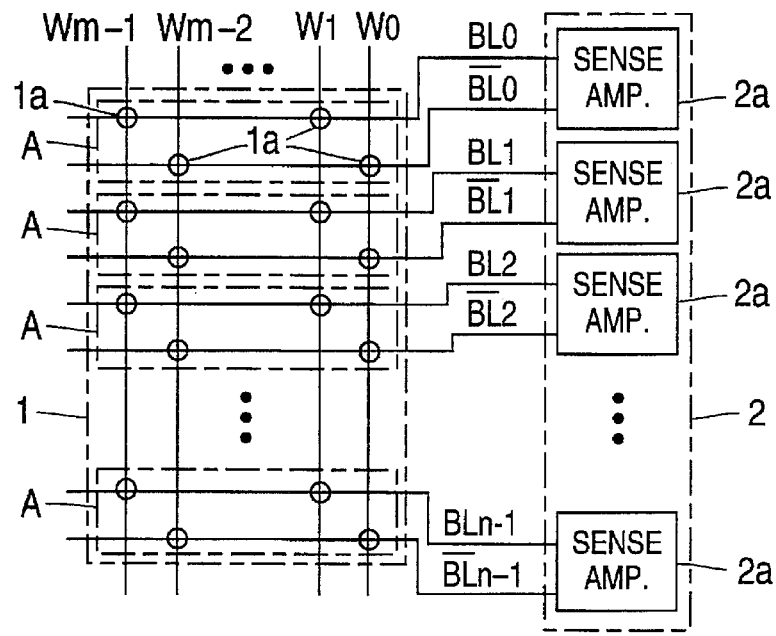
FIG. 1 is a plan view showing an arrangement of a memory cell array and a sense amplifier array in accordance with a first example of the invention.
Figure 2:
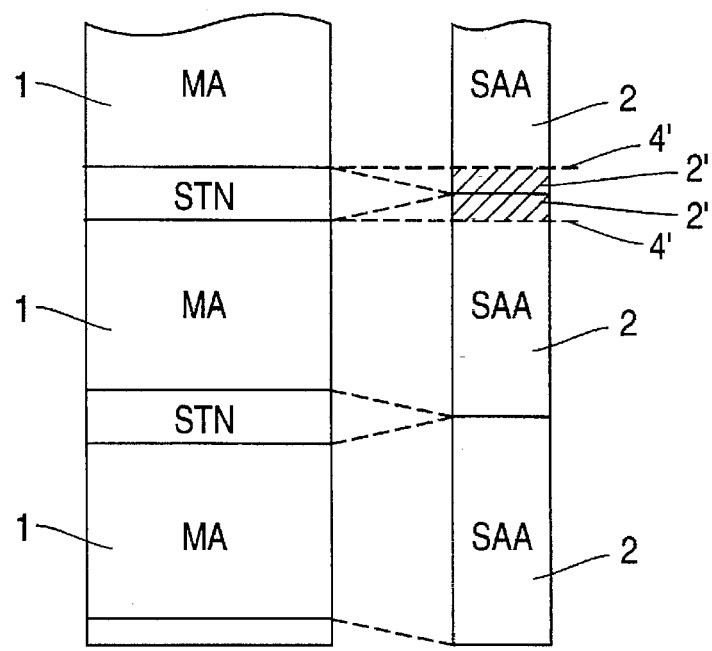
FIG. 2 is a schematic view showing the arrangement of the memory cell array and the sense amplifier array in accordance with the first example of the invention.

FIGS. 1 and 2 show a DRAM in a first example of the invention. On a chip (i.e., substrate) of the DRAM, as shown in FIG. 1, a memory cell array 1, a sense amplifier array 2, and other circuit elements which are not shown are formed. Hereinafter, examples of the present invention will be described using a DRAM of a folded bit line type, but the present invention is applicable to a DRAM of another type such as an open bit line type or the like.

Figure 10:
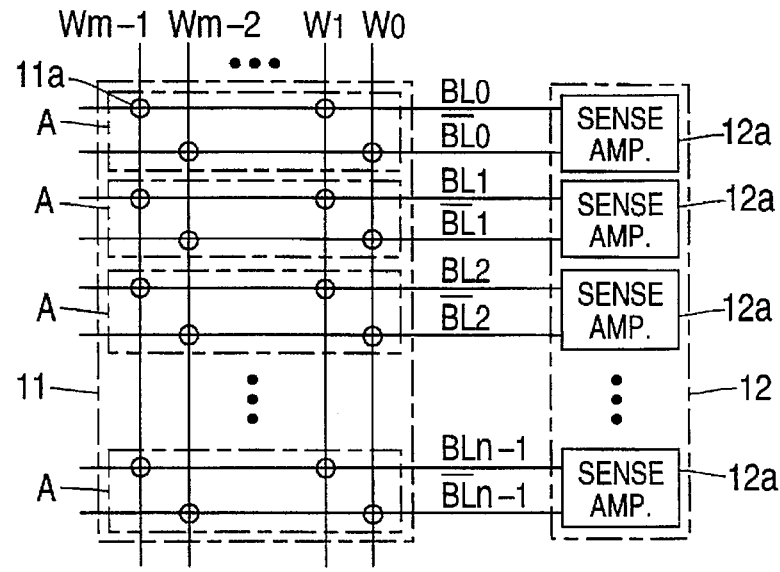
FIG. 10 is a plan view showing a prior art arrangement of a memory cell array and a sense amplifier array.
Figure 11:
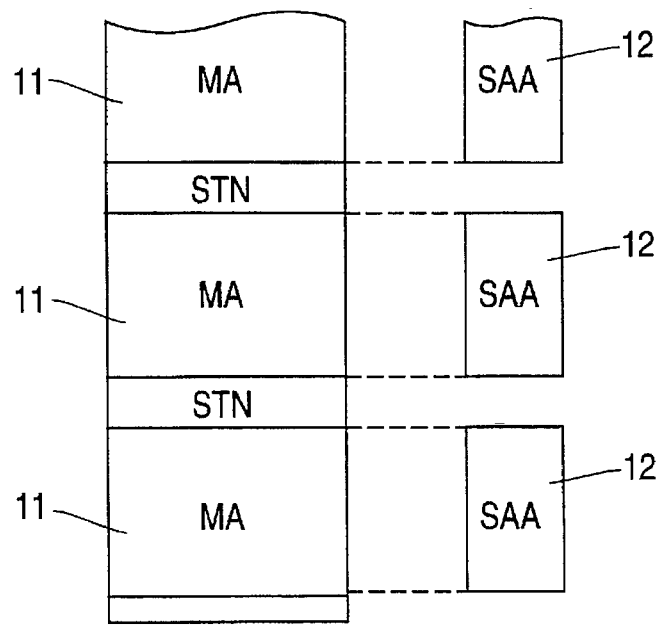
FIG. 11 is a schematic view showing a prior art arrangement of a memory cell array and a sense amplifier array.

Referring to FIG. 1, in the memory cell array 1, as in the conventional example shown in FIG. 10, m word lines $W_j$ (j=0, 1, ..., m−1) and n bit line pairs $BL_i$, $\overline{BL}_i$ (i=0, 1, ..., n−1) which cross the word lines $W_j$ at right angles are formed. Memory cells 1a are formed at alternate crossings of the bit line pairs $BL_i$, $\overline{BL}_i$ and the word lines $W_j$. Each of the memory cells 1a includes a MOS transistor and a capacitor and stores 1-bit data.

At the side of the memory cell array 1, the sense amplifier array 2 is formed. In the sense amplifier array 2, a plurality of sense amplifiers 2a are formed in a direction parallel to the word lines $W_j$. Each of the plurality of sense amplifiers 2a is connected to a bit line pair $BL_i$, $\overline{BL}_i$ which is extended from the memory cell array 1.

In FIG. 1, a region indicated by the reference label A on the memory cell array 1 is a region in which two columns of memory cells 1a to be connected to a common sense amplifier 2a are formed. Since the DRAM in this example has a large capacity, the memory cells 1a on the memory cell array 1 are formed in an extremely high density. As a result, the width of the region A is extremely small. However, the sense amplifier 2a is formed on a region having a larger width than that of the region A. Accordingly, in a transistor of the sense amplifier 2a, the channel length and the width of source/drain regions thereof can be made sufficiently larger than those of a usual transistor. Therefore, it is possible to maintain the high sensitivity of the sense amplifier 2a for detecting a very small potential difference.

If the width of the region A in which the two columns of memory cells 1a are formed is different from the width of a region in which the sense amplifier 2a is formed as described above, there exists a difference in arrangement between the memory cells 1a and the sense amplifiers 2a. Therefore, the bit line pairs $BL_i$, $\overline{BL}_i$ for connecting the memory cells 1a with the sense amplifiers 2a are extended in such a manner as to be appropriately directed (e.g., "bent"), as is shown in FIG. 1 to provide proper connection.

FIG. 2 schematically shows the arrangement of the above-mentioned memory cell array 1 and the sense amplifier array 2. In FIG. 2, the reference label MA indicates a region in which the memory cell array 1 is formed, and the reference label SAA indicates a region in which the sense amplifier array 2 is formed. The reference label STN represents a shunt region provided between the memory cell arrays 1. As is seen from FIG. 2, the region SAA in which the sense amplifier array 2 corresponding to the memory cell array 1 is formed extends out into a region at the side of the shunt region STN. The difference in arrangement, i.e., difference in width in a direction parallel to the word lines, between the memory cell array 1 and the sense amplifier array 2 is accommodated by utilizing the region at the side of the shunt region STN. This region is denoted by dashed lines 4' which are projected from the sides of the shunt region STN as is shown in FIG. 2. It can be seen in FIG. 2 how portions of the regions SAA (shown as shaded regions 2') extend into the regions at the sides of the shunt regions STN. Therefore, the difference in arrangement does not cause the area of a chip to increase.

Figure 12:
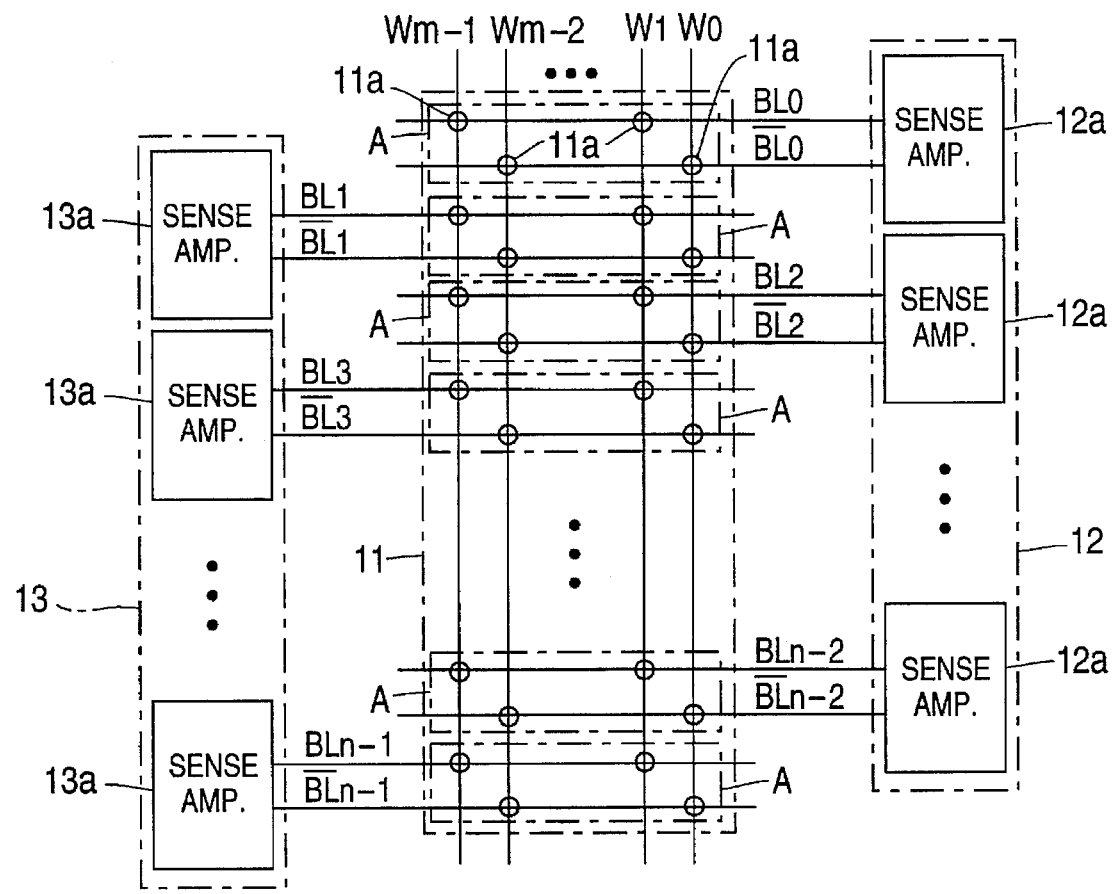
FIG. 12 is a plan view showing another prior art arrangement of a memory cell array and a sense amplifier array.
Figure 13:
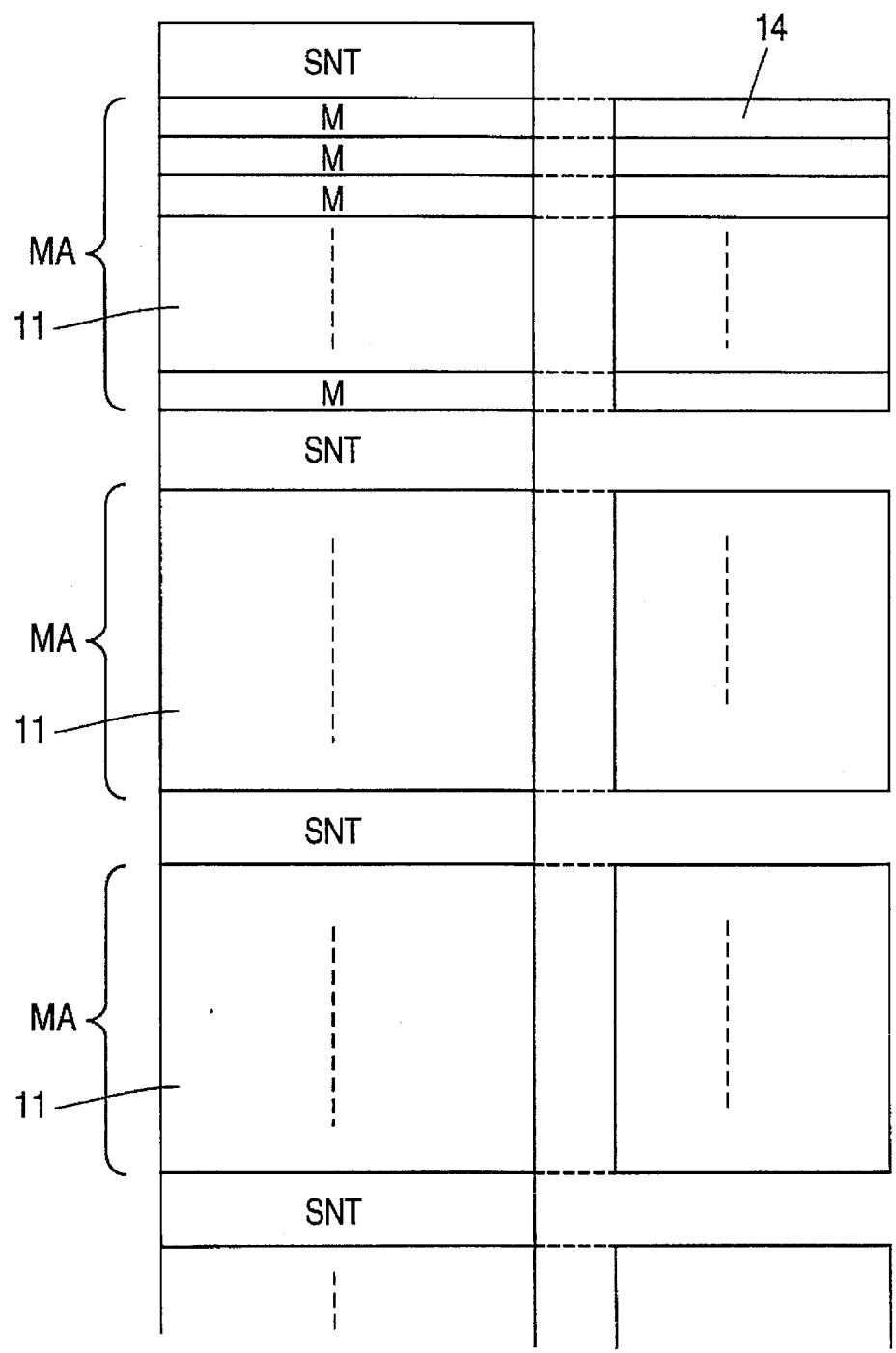
FIG. 13 is a schematic view showing a prior art arrangement of a memory cell array and a sense amplifier array.

Moreover, in this example, the sense amplifier array 2 is formed at only one side of the memory cell array 1. Therefore, it is possible to reduce the area of the chip as compared with a case in which the sense amplifier arrays are formed at both sides of the memory cell array 1 as is shown in FIG. 12.

EXAMPLE 2

Figure 3:
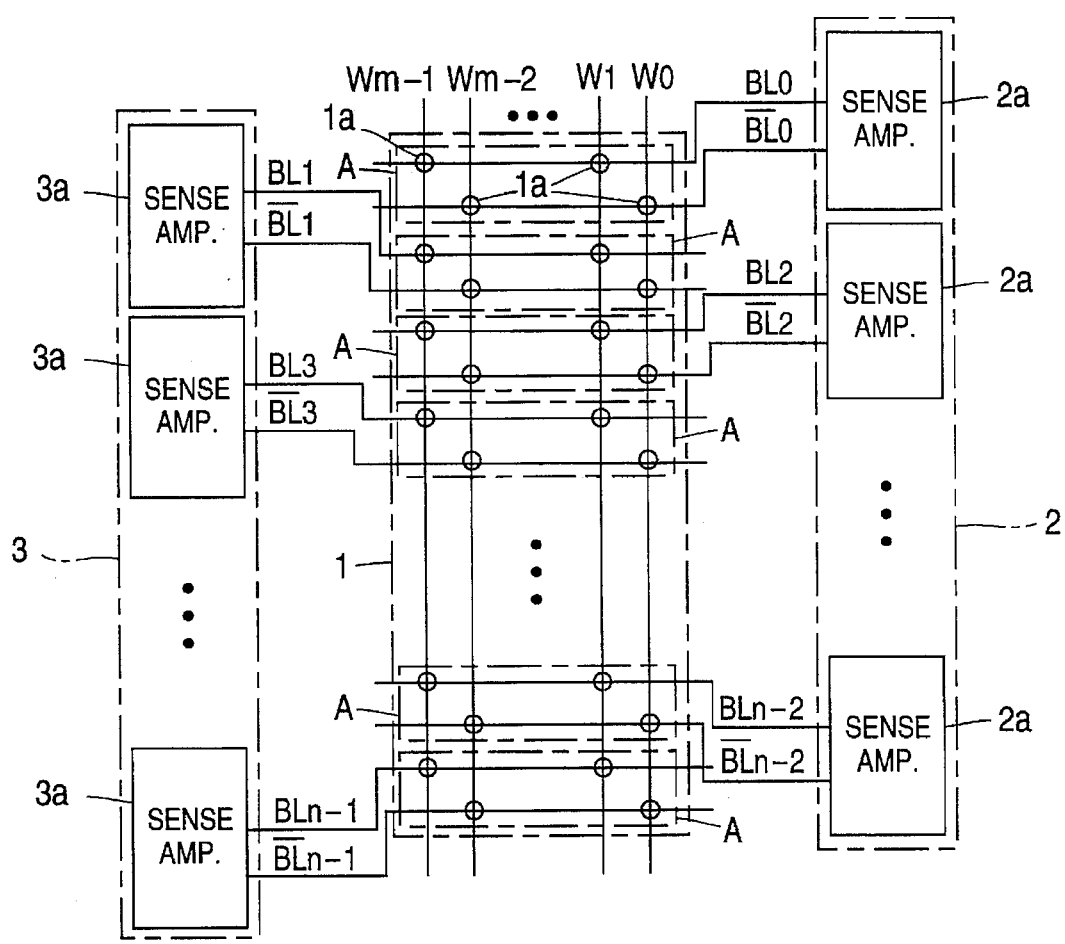
FIG. 3 is a plan view showing an arrangement of a memory cell array and a sense amplifier array accordance with a second example of the invention.
Figure 4:
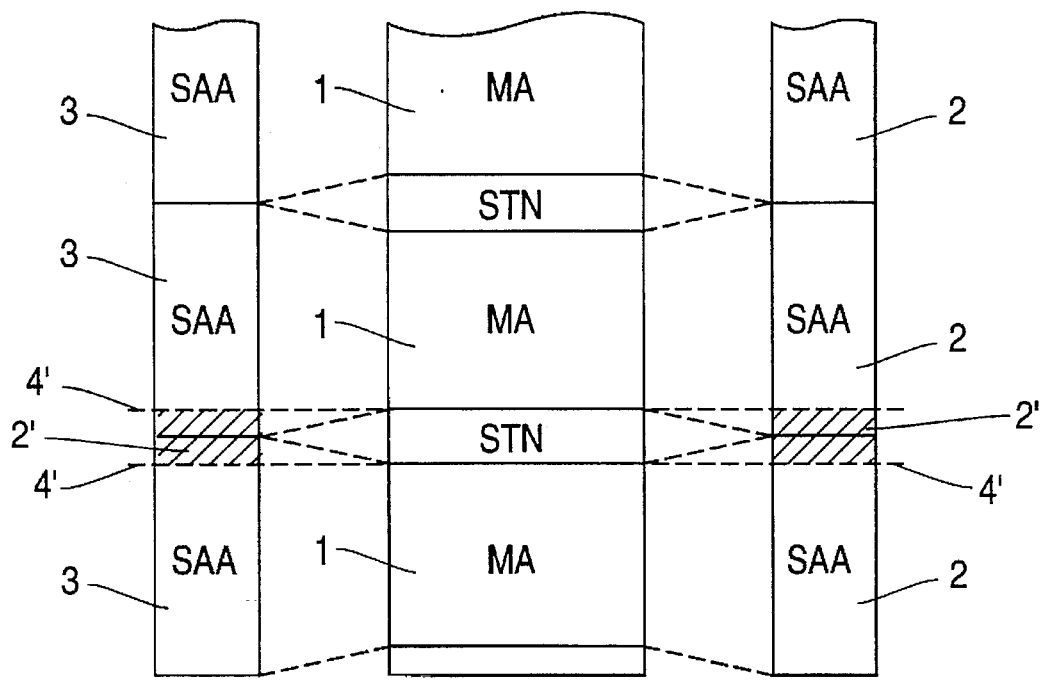
FIG. 4 is a schematic view showing the arrangement of the memory cell array and the sense amplifier array in accordance with the second example of the invention.

FIGS. 3 and 4 show a DRAM according to another example of the invention. In FIGS. 3 and 4, like components are indicated by like reference numerals as in FIGS. 1 and 2 and the descriptions thereof are omitted.

This example is effective in a case where it is desirable to maintain the sensitivity of the sense amplifiers 2a even beyond that provided by the first example.

In this example, as shown in FIG. 3, sense amplifier arrays 2 and 3 are formed on both sides of a memory cell array 1. Bit line pairs $BL_i$, $\overline{BL}_i$ are alternately connected to sense amplifiers 2a on the sense amplifier array 2 on one side and to sense amplifiers 3a on the sense amplifier array 3 on the other side. Regions in which the sense amplifiers 2a and 3a are respectively formed have a width larger than double the width of the region A in which two columns of memory cells 1a are formed. Thus, since the regions in which the sense amplifiers 2a and 3a are respectively formed can have a large width, it is possible to maintain a high sensitivity of the sense amplifiers 2a and 3a, as compared with the first example and particularly as compared to the prior art.

Also, in this example, the difference in arrangement, i.e., width, between the memory cell array 1, and the sense amplifier arrays 2 and 3 is accommodated by utilizing a region at the side of a shunt region STN; this region being denoted by dashed lines 4' projecting from the sides of the shunt region STN, as is shown in FIG. 4. Therefore, the difference in arrangement does not cause the area of a chip to increase.

EXAMPLE 3

Figure 5:
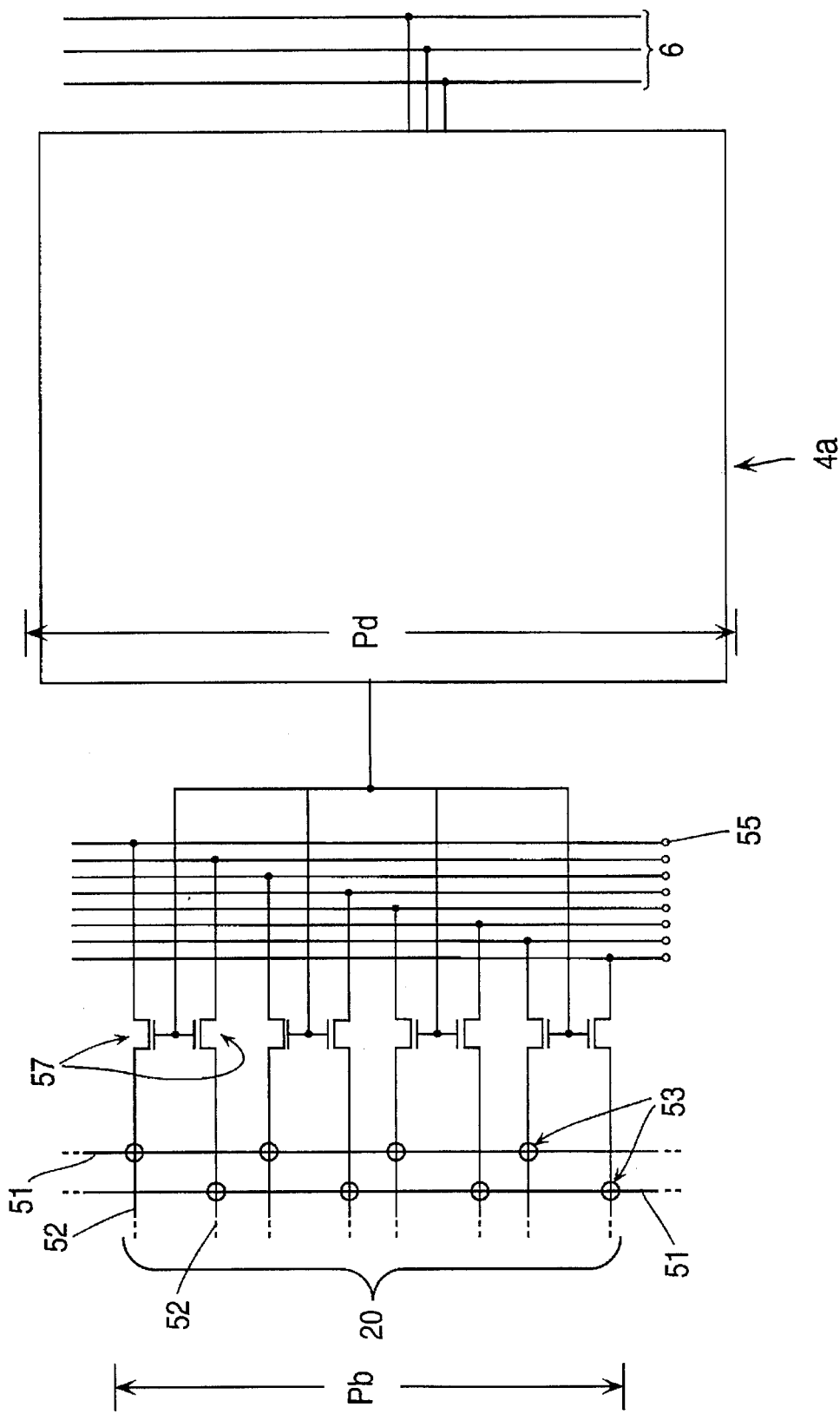
FIG. 5 is a plan view showing part of a circuit configuration in accordance with a third example of the invention.

FIG. 5 shows part of a circuit configuration in a DRAM in accordance with another example of the present invention. As is shown in FIG. 5, word lines 51 and bit lines 52 which cross each other at right angles are formed. Memory cells 53 are formed at alternate crossings of the word lines 51 and the bit lines 52. Each of the memory cells 53 is connected to the corresponding word line 51 and bit line 52. The memory cells 53 are arranged in a matrix so as to constitute a memory cell array (shown in representative portion).

A column decoder 4a is used to select one or more bit lines 52 among the plurality of bit lines 52 in accordance with a column address signal provided on lines 6 as described more fully below. The circuitry of the column decoder 4a is the same as that of a conventional column decoder, so that the circuitry thereof is not shown in FIG. 5.

The plurality of bit lines 52 are divided into a plurality of bit line groups 20. Each of the plurality of bit line groups 20 includes one or more of the bit lines 52. The column decoder 4a is used to select one bit line group 20 among the plurality of bit line groups 20 in accordance with a column address signal transmitted through column address signal lines 6, and then connects the bit lines 52 included in the selected bit line group 20 with input and output lines 55 via corresponding switching elements 57. In this example, each of the bit line groups 20 is made up of four bit line pairs, but the number of bit line pairs which are included in one bit line group 20 is not limited to four as will be appreciated. For example, each of the bit line groups 20 may be made up of eight bit line pairs.

The arranged pitch $P_b$ of the bit line groups 20 in a direction along the word lines 51 is defined by a total width of the eight columns of memory cells 53 connected to the respective bit lines in the four bit line pairs. In this example, the arranged pitch of the bit line groups 20 is $P_b$=8.0 μm. The arranged pitch $P_d$ of the column decoders 4a is $P_d$=8.8 μm, which is larger than that of the bit line groups 20.

Figure 6:
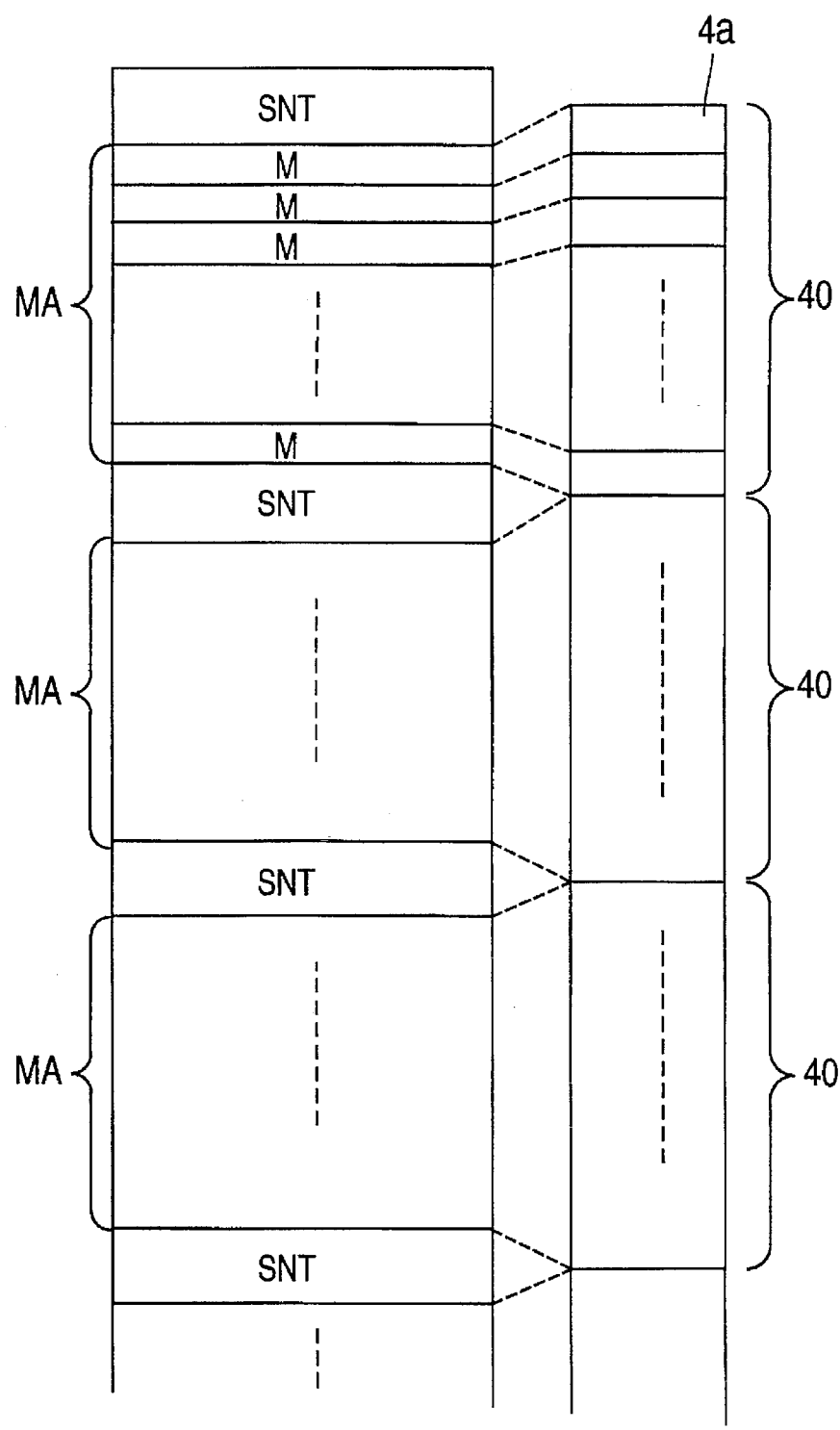
FIG. 6 is a schematic view showing an arrangement of a memory cell array and a column decoder array in accordance with the third example of the invention.

FIG. 6 schematically shows the arrangement of the above-mentioned memory cells 53 and the column decoders 4a. In FIG. 6, the reference label MA indicates a region in which a memory cell array is formed, and the reference label M indicates a region in which columns of memory cells 53 (memory cell columns) corresponding to one column decoder 4a are formed. The reference label STN indicates a shunt region provided between the memory cell arrays. As seen from FIG. 6, a region in which a column decoder array 40 corresponding to a memory cell array is formed extends out into a region at the side of the shunt region STN. The difference in arrangement or pitch between the memory cell array and the column decoder array 40 is accommodated by utilizing the region at the side of the shunt region STN. Therefore, the difference in arrangement does not cause the area of a chip to increase. As described above, in this example, one column decoder 4a corresponds to eight memory cell columns, so that eight columns of memory cells (not shown) are formed in each of the regions M shown in FIG. 6.

Generally, in a DRAM of 64 megabits, it is necessary to set the width of the shunt region STN to be about 1 to 10 μm. Each of the widths of a dummy pattern or a pattern for reducing a difference in level which are formed at both sides of the shunt region STN is required to be about 4 to 8 μm. The arranged pitch of the eight columns of memory cells is set to be about 0.8 to 1.0 μm. In the memory cell array forming region MA, 128 to 512 sets of two columns of memory cells are formed. Therefore, the ratio of the shunt region STN to the memory cell array forming region MA is 2.5 to 25%.

In this example, in order to effectively utilize the region at the side of the shunt region STN, the region in which a column decoder 4a is formed is set so as to have a width in a direction along the word line increased by about 10% and a length in a direction along the bit line decreased by about 10%. As a result, the area of the column decoder 4a remains unchanged, but the space efficiency of the whole chip is improved. Therefore, it is possible to reduce the area of the chip.

EXAMPLE 4

Figure 7:
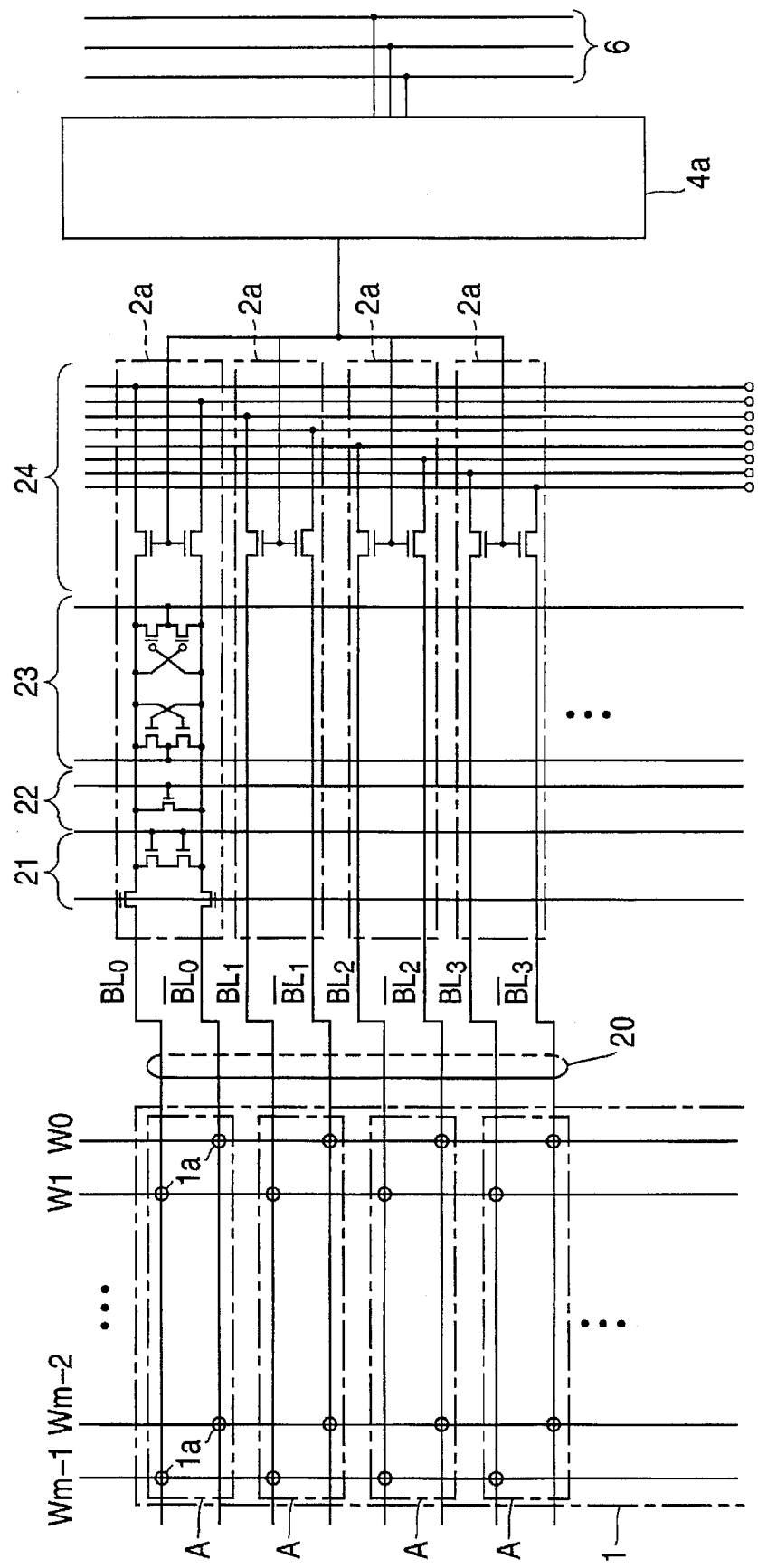
FIG. 7 is a plan view showing part of a circuit configuration in accordance with a fourth example of the invention.

FIG. 7 shows part of the circuit configuration of a DRAM in accordance with another example of the invention. In this circuit configuration, the memory cell array 1 and the sense amplifiers 2a shown in FIG. 1 are combined with a column decoder such as the column decoder in the circuit configuration shown in FIG. 5.

When a column decoder 4a is selected in accordance with a column address signal transmitted via the column address signal lines 6, four sense amplifiers 2a connected to the selected column decoder 4a are selected. Then, word lines $W_j$ are selected in accordance with a row address signal (not shown). A reading operation is performed for four memory cells 1a formed at the crossings of the selected word line $W_j$ and the bit lines which are connected to the selected sense amplifiers 2a.

Thus, one column decoder 4a corresponds to four sense amplifiers 2a, four bit line pairs $BL_i$, $\overline{BL}_i$ (a bit line group 20) and eight columns of memory cells 1a for this particular example. However, the present invention is not limited to the above relationship. For example, one column decoder 4a may correspond to eight sense amplifiers 2a, eight bit line pairs $BL_i$, $\overline{BL}_i$, and sixteen memory cells 1a. In the example represented in FIG. 7, the arranged pitch of the bit line groups 20 (in a direction along the word lines $W_j$) is 8.0 μm. The arranged pitch of the column decoders 4a (in a direction along the word lines $W_j$) is 8.8 μm, which is larger than that of the bit line groups 20.

The sense amplifier 2a in the exemplary embodiment includes a precharge circuit 21, an equalizing circuit 22, a sense amplifier circuit 23, and a bit line input and output circuit 24.

Figure 8:
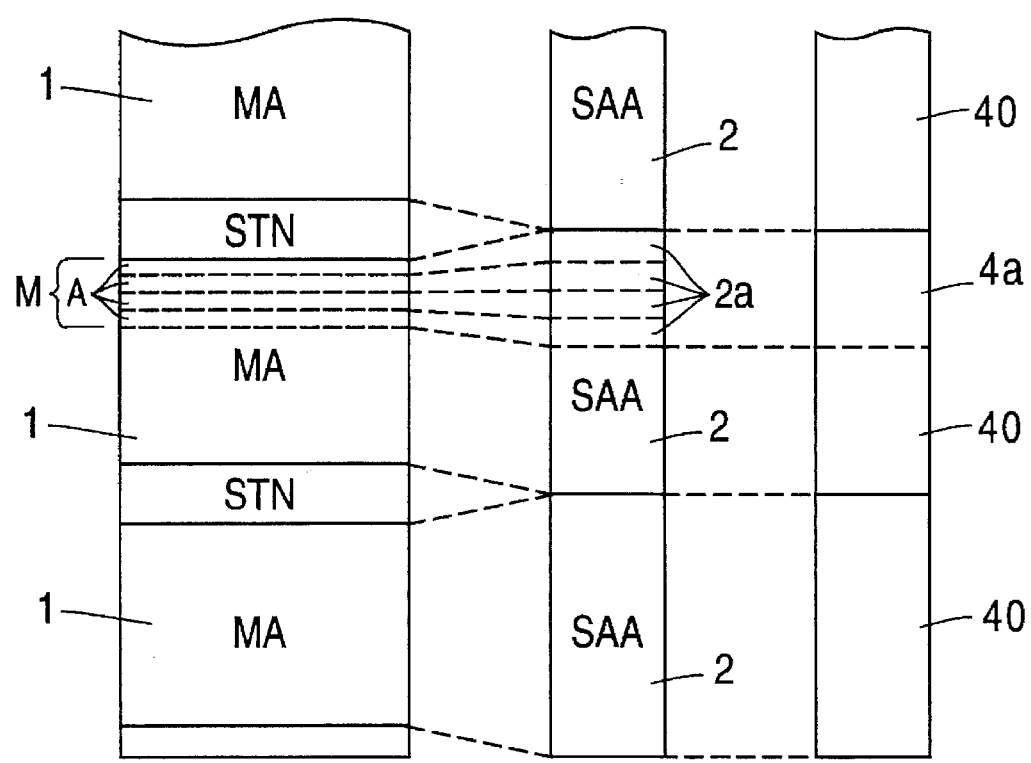
FIG. 8 is a schematic view showing an arrangement of a memory cell array, a sense amplifier array and a column decoder array in accordance with the fourth example of the invention.

FIG. 8 schematically shows the arrangement of the above-mentioned memory cell array 1, the sense amplifier array 2 and the column decoders 4a. In FIG. 8, the arrangement of the column decoders 4a shown in FIG. 6 is added to the arrangement of the memory cell array 1 and the sense amplifier array 2 shown in FIG. 2, whereby the relative locations thereof are clearly shown.

In FIG. 8, the reference label MA indicates a region in which the memory cell array 1 is formed. In the region MA, the reference label M indicates a region in which memory cell columns corresponding to one column decoder 4a are formed, and the reference label A indicates a region in which two columns of memory cells 1a are formed. The reference label SAA indicates a region in which one sense amplifier array 2 is formed, and the reference label STN indicates a shunt region provided between the memory cell arrays 1.

The sense amplifier 2a is formed in a region having a larger width than that of the region A. Accordingly, the transistor of the sense amplifier 2a can have a channel length and a width of source/drain region sufficiently larger than those of a usual transistor, so that it is possible to maintain the high sensitivity of the sense amplifier 2a for detecting a very small potential difference.

The column decoder 4a is formed in a region having a width which is equal to a total width of the corresponding sense amplifiers 2a. In this example, since the column decoder 4a corresponds to four sense amplifiers 2a, the column decoder 4a is formed in a region having a width which is substantially four times as large as that of the sense amplifier 2a.

As shown in FIG. 8, each of the sense amplifier array 2 and the column decoder array 40 corresponding to the memory cell array 1 is formed in a region which extends out into a region at the side of the shunt region STN. The difference in arrangement (width) between the memory cell array 1 and the sense amplifier array 2, and the difference in arrangement (width) between the memory cell array 1 and the column decoder array 40 are accommodated by utilizing the region at the side of the shunt region STN. Therefore, the differences in arrangement does not cause the area of a chip to increase.

In this example, in order to effectively utilize the region at the side of the shunt region STN, the region in which the column decoder 4a is formed is set to have a width in a direction along the word line increased by about 10% and a width in a direction along the bit line decreased by about 10%. As a result, the area of the column decoder 4a remains unchanged, but the space efficiency of the whole chip is improved. Therefore, it is possible to reduce the area of the chip. Regarding the sense amplifier 2a, the region in which the sense amplifier 2a is formed is set to have an increased width in a direction along the word line and a decreased width in a direction along the bit line, thereby attaining the same effects.

EXAMPLE 5

Figure 9:
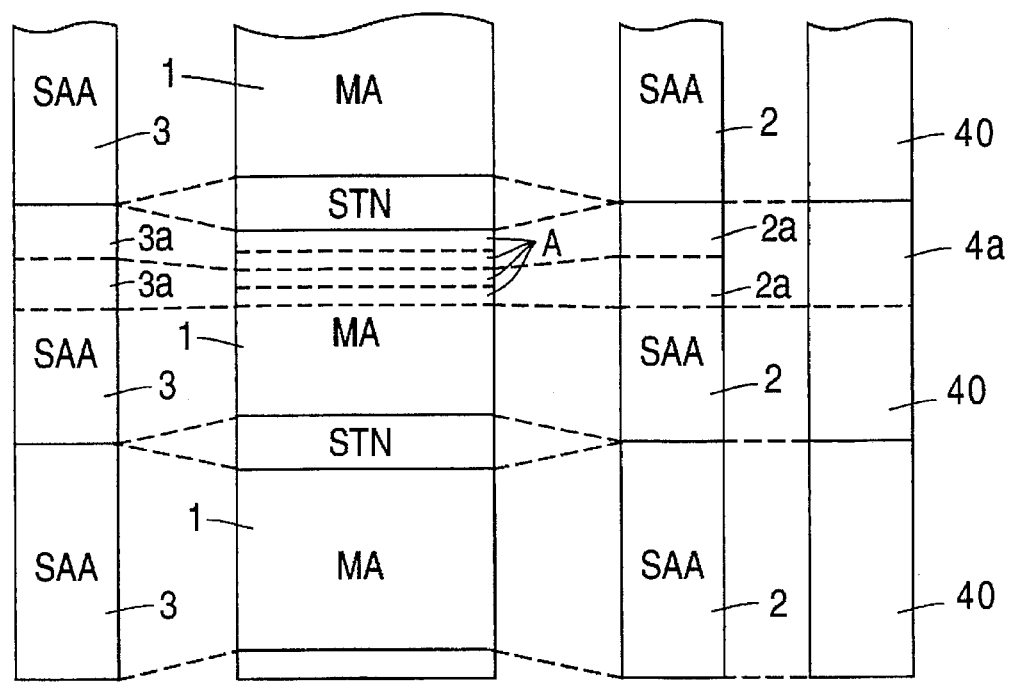
FIG. 9 is schematic view showing an arrangement of a memory cell array, a sense amplifier array and a column decoder array in accordance with a fifth example of the invention.

FIG. 9 schematically shows an arrangement of a memory cell array 1, a sense amplifier array 2 and column decoders 4a in another example. In FIG. 9, the arrangement of column decoders 4a shown in FIG. 6 is added to the arrangement of the memory cell array 1 and the sense amplifier arrays 2 and 3 shown in FIG. 4, whereby the relative locations thereof are clearly shown.

In this example, as shown in FIG. 9, sense amplifier arrays 2 and 3 are formed at both sides of the memory cell array 1. Bit line pairs $BL_i$, $\overline{BL}_i$ are alternately connected to sense amplifiers 2a on the sense amplifier array 2 on one side of the memory cell arrays 1, and to sense amplifiers 3a on the sense amplifier array 3 on the other side. The regions in which the sense amplifiers 2a and 3a are respectively formed have a width which is larger than a double width of the region A in which two columns of memory cells are formed. Thus, since the regions in which the sense amplifiers 2a and 3a are respectively formed have a larger width than in the first example, it is possible to maintain the high sensitivity of the sense amplifiers 2a and 3a.

The column decoder 4a is formed in a region having a width which is substantially equal to a total width of the corresponding sense amplifiers 2a and 3a. In this example, the column decoder 4a corresponds to four sense amplifiers 2a and 3a, so that the column decoder 4a is formed in a region having a width which is substantially twice as large as that of the sense amplifier 2a or 3a.

Also, in this example, the differences in arrangement between the memory cell array 1, and the sense amplifier arrays 2 and 3 are accommodate by utilizing the region at the side of the shunt region STN. Therefore, the difference in arrangement does not cause the area of a chip to increase.

According to the invention, even when memory cells are formed with high density, it is possible to maintain the sensitivity of the sense amplifier. By setting the region in which the column decoder 4a is formed so as to have an increased width in a direction along the word line and a decreased width in a direction along the bit line, the region at the side of the shunt region STN can be effectively utilized. As a result, though the area of the column decoder 4a remains unchanged, the space efficiency of the whole chip is improved, whereby the area of the chip can be reduced. As to the sense amplifiers 2a, the same effects can be attained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising:

a plurality of word lines;

a plurality of bit lines;

a plurality of first regions in which respective memory cell arrays including a plurality of memory cells are formed;

at least one second region provided between said first regions for reducing the resistance of said plurality of word lines, said first regions and said second region being arranged along a first direction; and wherein a third region is located adjacent to and continuously along a length of said plurality of first regions and at least one of said second regions, said third region having a circuit formed therein for selecting at least one of said plurality of bit lines, and wherein said circuit includes a column decoder.

2. A semiconductor memory device comprising:

a plurality of word lines;

a plurality of bit lines;

a plurality of first regions in which respective memory cell arrays including a plurality of memory cells are formed;

at least one second region provided between said first regions for reducing the resistance of said plurality of word lines, said first regions and said second region being arranged along a first direction; and wherein a third region is located adjacent to and continuously along a length of said plurality of first regions and at least one of said second regions, said third region having a circuit formed therein for selecting at least one of said plurality of bit lines, wherein said circuit includes a sense amplifier, and a column decoder coupled to said sense amplifier.

* * * * *